(12) United States Patent
Kerr et al.

(10) Patent No.: US 12,483,227 B2
(45) Date of Patent: Nov. 25, 2025

(54) SYSTEMS AND METHODS FOR MEASURING ON-DIE DI/DT VOLTAGE DROOPS

(71) Applicant: Google LLC, Mountain View, CA (US)

(72) Inventors: Benjamin James Ogden Kerr, Danville, CA (US); Erik Jens Loscalzo, Manhasset, NY (US); Kok-Hong Chan, Santa Clara, CA (US)

(73) Assignee: Google LLC, Mountain View, CA (US)

( * ) Notice: Subject to any disclaimer, the term of this patent is extended or adjusted under 35 U.S.C. 154(b) by 43 days.

(21) Appl. No.: 18/545,502

(22) Filed: Dec. 19, 2023

(65) Prior Publication Data

US 2025/0202460 A1  Jun. 19, 2025

(51) Int. Cl.
*H03K 5/00* (2006.01)
*H03K 3/037* (2006.01)
*H03K 3/038* (2006.01)
*H03K 5/133* (2014.01)
*H03K 19/21* (2006.01)

(52) U.S. Cl.
CPC ........... *H03K 3/038* (2013.01); *H03K 3/0375* (2013.01); *H03K 5/133* (2013.01); *H03K 19/21* (2013.01)

(58) Field of Classification Search
CPC ...... H03K 3/038; H03K 3/0375; H03K 5/133; H03K 19/21
See application file for complete search history.

(56) References Cited

U.S. PATENT DOCUMENTS

| | | |
|---|---|---|
| 8,847,777 B2 | 9/2014 | Ramaswami |
| 9,689,917 B2 | 6/2017 | Turullols et al. |
| 9,772,375 B2 | 9/2017 | Turullols et al. |
| 11,108,382 B1 | 8/2021 | Wong et al. |
| 11,728,814 B1 * | 8/2023 | Fu ............................ H03L 7/091 327/158 |
| 2008/0104561 A1 * | 5/2008 | Carpenter ........... G06F 30/3312 716/104 |
| 2010/0229021 A1 * | 9/2010 | Konstadinidis ......... G06F 1/305 713/340 |
| 2014/0070862 A1 | 3/2014 | Palmer et al. |
| 2014/0354264 A1 | 12/2014 | Turullols |
| 2016/0033576 A1 | 2/2016 | Turullols et al. |

(Continued)

OTHER PUBLICATIONS

Zheng, K. "A Comparison of Digital Droop Detection Techniques in ASAP7 FinFET", EE 241 Spring 2020 Final Project Reports, 6 pages.

(Continued)

*Primary Examiner* — Tuan T Lam
(74) *Attorney, Agent, or Firm* — Lerner David LLP

(57) ABSTRACT

The technology is directed to a di/dt circuit for detecting and measuring the di/dt droops on silicon. The circuit may be calibrated to account for silicon process spread. When a di/dt droop has been detected by the circuit, the magnitude of the droop can be measured by the circuit, allowing the system to determine the best course of action. For instance, when the measured droop is within predetermined limits, the system can continue to operate. However, in the event the measured droop is outside of the limits, the system can take different measures to reduce the clock frequency and therefore reduce the step change in power to prevent SDCs.

15 Claims, 5 Drawing Sheets

(56) References Cited

U.S. PATENT DOCUMENTS

| | | | |
|---|---|---|---|
| 2016/0380619 A1 | 12/2016 | Bollapalli et al. | |
| 2018/0091125 A1* | 3/2018 | Carlson | H03K 5/19 |
| 2018/0367128 A1* | 12/2018 | Vezyrtzis | H03K 3/0372 |
| 2021/0148957 A1 | 5/2021 | Tuncer et al. | |
| 2021/0405725 A1 | 12/2021 | Kosonocky et al. | |
| 2023/0396249 A1* | 12/2023 | Remple | H03K 5/14 |
| 2024/0281045 A1* | 8/2024 | Kumar | G01R 31/3004 |

OTHER PUBLICATIONS

Extended European Search Report for European Patent Application No. 24221061.5 dated May 22, 2025. 21 pages.

* cited by examiner

SYSTEMS AND METHODS FOR MEASURING ON-DIE DI/DT VOLTAGE DROOPS

BACKGROUND

Computer processors, such as machine learning and artificial intelligence (AI) processors, GPUs, CPUs, etc., can consume large amounts of power, such as hundreds of Watts, over a short duration, such as microseconds. Such power step changes, which may occur when the processor goes from a low-power idle state to a high-power state, can cause a voltage disturbance in the power being supplied to the processor. The voltage disturbance may be caused by the power delivery network (PDN) being unable to provide sufficient energy to the processor as quickly as needed during the power step change. In this regard, during the power step change, inductance in the PDN may cause a di/dt (instantaneous current/time) droop on the processor's PDN. Such di/dt droops are often unavoidable, as large power changes arise due to the architecture and operation of high-performance processors. The PDN of such processors can be optimized to a point, but the laws of physics and advanced silicon process nodes make di/dt droops difficult to manage and mitigate.

Voltage disturbances created by di/dt droops may have detrimental effects on the operation of processors. For instance, the processor may operate unreliably when a di/dt droop is large, such as greater than a few millivolts. Moreover, calculations performed by the processor during a di/dt droop may be incorrect, causing soft data errors (SDEs) or silent data corruption (SDCs). These SDCs can, in turn, lead to errors in machine learning training models or machine learning inference using the trained models. While di/dt droops may be addressed by providing additional DC voltage margin to accommodate the di/dt droops. However, this extra DC voltage margin causes additional power consumption, increasing electricity and cooling costs in a data center environment. Alternatively, or additionally, the maximum operating frequency of the processor may be reduced to eliminate or reduce di/dt droops but reducing the operating frequency will reduce the overall performance of the processors.

Existing di/dt detection systems to detect and measure di/dt droops are difficult to calibrate since the behavior and resolution of these di/dt detection systems depend on the silicon process spread. The silicon process spread, which is the variation in operation between silicon dies that is the result of slight variations during manufacturing (e.g., doping, slicing, printing, etc.), varies for each silicon die that is manufactured. As such, existing systems generally require a manufacturing test process to measure the performance of the di/dt detection circuits, calibrate the circuits, and store the calibration data in memory on the silicon die. Software-based calibration schemes may also be used, but such software-based calibration schemes often introduce noise and reduce the sensitivity of the di/dt detection systems. Such noise can limit the usefulness of the existing system and also introduce more variability to the di/dt detection system. Moreover, existing solutions often require precise silicon layouts to ensure all delays are carefully matched and typically require detailed simulation to ensure the layout is correct before the circuit is fabricated in silicon. Any errors in the layout could result in the circuit not being able to detect di/dt droops correctly or at all. Correcting layout errors typically requires a restart of the silicon layout, which may incur millions of dollars in silicon respin costs.

BRIEF SUMMARY

The technology is generally directed to detecting and measuring voltage droops on silicon. The voltage droops may be di/dt droops. A circuit may be configured to detect and measure the voltage droops. For example, the circuit may include a chain of adjustable delay elements. The delay elements may connect to a synchronizer that samples the output of the delay element. The delay element may be configured to allow a static delay through a cell to be changed, or trimmed, based on the silicon process information. A large chain of delay elements allows for large droops to be measured and a sliding window to be implemented. For example, when a measured droop is within predetermined limits, the system may operate without any changes. However, when the measured droop is outside of the limits, the system may change the delay to cause the droop to become within the predetermined limits.

One aspect of the disclosure is directed to a droop detection circuit. The droop detection circuit may comprise a set of parallel tri-state inverters, a set of synchronizers, a set of XNORs, and a set of edge registers. Each parallel tri-state inverter of the set of parallel tri-state inverters may be connected to a respective synchronizer of the set of synchronizers, pairs of adjacent synchronizers of the set of synchronizers are connected to a XNOR in the set of XNORs, and each XNOR may be connected to a respective edge register in the set of edge registers.

A trim line may be connected to each parallel tri-state inverter of the set of parallel tri-state inverters. A voltage line, VDD, may be connected to each parallel tri-state inverter of the set of parallel tri-state inverters. A clock may be connected. The set of parallel tri-state inverters may include "N" number of parallel tri-state inverters, N being an integer greater than 0. Each parallel tri-state inverter of the set of parallel tri-state inverters may include 24 to 32 inverters.

Each synchronizer of the set of synchronizers may be a metastability enhanced D-type flip-flop. Each flip-flop may share a common clock.

The set of edge registers may output a binary vector representing signal edges, as a signal progresses across the set of parallel tri-state inverters. A distance between signal edges may be constant when a supplied voltage to the set of parallel tri-state inverters is constant. Signal edges may move right when a supplied voltage to the set of parallel tri-state inverters has a voltage droop. Signal edges may move left when a supplied voltage to the set of parallel tri-state inverters has a voltage increase. Signal edges may move closer together when a trim value on a trim line connected to each parallel tri-state inverter of the set of parallel tri-state inverters is reduced. Signal edges may move apart when a trim value on a trim line connected to each parallel tri-state inverter of the set of parallel tri-state inverters is increased. A location of a chip on a process spread may be determined based on a comparison of the distance between signal edges and an expected distance.

Another aspect of the disclosure is directed to a method for calibrating a circuit to account for silicon process spread. The method may comprise determining a voltage droop, determining, based on the voltage droop, a distance between edge vector values in a sampler chain, comparing the distance between edge vector values to an expected distance and increasing a delay when the distance between edge vector values is less than the expected distance, or decreasing the delay when the distance between edge vector values is greater than the expected distance, or ending the calibration when the distance between edge vector values is equal to the expected distance.

After increasing or decreasing the delay, the method may further comprise determining, based on the increased or decreased delay, an updated voltage droop, determining, based on the updated voltage droop, an updated distance between edge vector values in an updated sampler chain, and comparing the updated distance between edge vector values to the expected distance.

The circuit may be a droop detection circuit comprising a set of parallel tri-state inverters, a set of synchronizers, a set of XNORs, and a set of edge registers. Each parallel tri-state inverter of the set of parallel tri-state inverters may be connected to a respective synchronizer of the set of synchronizers, pairs of adjacent synchronizers of the set of synchronizers are connected to a XNOR in the set of XNORs, and each XNOR may be connected to a respective edge register in the set of edge registers. The set of edge registers may output a binary vector representing the edge vector values, as a signal progresses across the set of parallel tri-state inverters.

Increasing the delay may comprise increasing a trim value on a trim line connected to each parallel tri-state inverter of the set of parallel tri-state inverters. Decreasing the delay may comprise decreasing the trim value on the trim line connected to each parallel tri-state inverter of the set of parallel tri-state inverters.

DETAILED DESCRIPTION

The technology is directed to a di/dt circuit for detecting and measuring the di/dt droops on silicon. The circuit may be calibrated to account for silicon process spread. When a di/dt droop has been detected by the circuit, the magnitude of the droop can be measured by the circuit, allowing the system to determine the best course of action. For instance, when the measured droop is within predetermined limits, the system can continue to operate. However, in the event the measured droop is outside of the limits, the system can take different measures to reduce the clock frequency and, therefore, reduce the step change in power to prevent SDCs.

The di/dt circuit includes a linear chain of delay elements. With such a chain, other circuit improvements can be realized. For instance, large droops can be measured, a sliding window can be implemented to focus on one particular edge, and by taking multiple samples from the sampler chain over time, the characteristics of the droop can be plotted over time. This can give insights into the actual voltage response of the silicon PDN directly from the silicon die, which is generally impossible to measure with conventional measurement equipment (oscilloscopes, etc.). Since there is only one delay element in the circuit, it is much more responsive to voltage variation, and the circuit behavior is much easier to predict using simulation. A precise silicon layout is still required, but the effort is reduced as the circuit is highly regular, so multiple copies of the same layout can be reused. As a result, the circuit is more likely to operate correctly on silicon which may reduce the possibility of a silicon respin.

Figure 1:
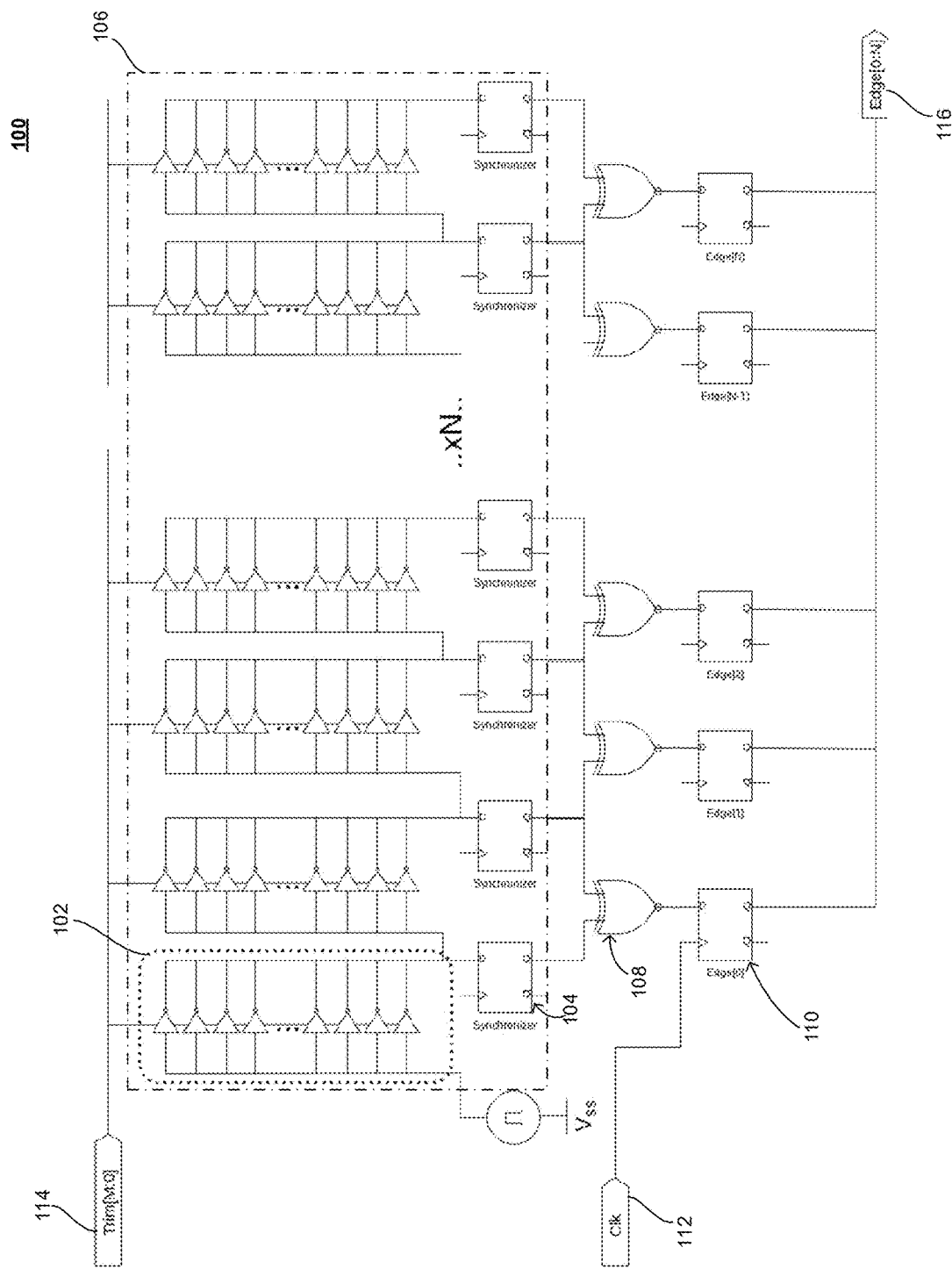
FIG. 1 is an example schematic diagram of a droop detection circuit according to aspects of the disclosure.

FIG. 1 is a schematic diagram of an example circuit. The circuit 100 may be a di/dt detection circuit. According to some examples, the circuit 100 may be a droop detection circuit. The circuit 100 may include a linear chain of adjustable delay elements 102, synchronizers 104, XNORs 108, edge registers 110, a clock 112, a Trim[M:0] vector 114, and an Edge[0:N] vector 116. In the circuit 100, only one delay element 102, synchronizer 104, XNOR 108, and edge register 110 is identified with a reference number for clarity purposes. However, circuit 100 may include any N number of delay elements 102 and synchronizers 104. The circuit 100 may include N−1 number of XNORs 108 and Edge registers 110. N may be, for example, any integer value. In some examples, N may be between 500 and 1000. In some examples, N may be any value greater than 0. Accordingly, N being between 500 and 1000 is just one example and is not intended to be limiting.

The delay elements 102 may be, in some examples, parallel tri-state inverters. According to some examples, "M" number of parallel tri-state inverters may be included in each stage of parallel tri-state inverters. M may be around 24 to 32, although fewer or more parallel tri-state inverters may be included in each stage.

The circuit 100 may include N stages of delay elements 102. Each delay element 102 may connect to a synchronizer 104. The synchronizer may sample the output of the delay element 102. The synchronizer may be, in some examples, a stable synchronizer cell. The delay elements 102 and synchronizers 104 may form a "sampler chain" 106.

The adjacent synchronizers 104 may provide outputs to the XNORs 108. The XNORs 108 may be connected to edge registers 110. The di/dt circuit 100 may include N stages of delay elements 102, e.g., parallel tri-state inverters. The di/dt circuit may include N−1 synchronizers, XNORs, and Edge registers. N may be any integer. According to some examples, N may be between 500 and 1000, or more or less depending on the operating frequency of the processor.

Each synchronizer 104 may be a metastability enhanced D-type flip-flop. According to some examples, the synchronizers 104 may share a common clock 112, labeled as 'Clk'. The clock 112 frequency may be around 2 GHz but may be more or less depending on the operating frequency of the processor.

According to some examples, the di/dt circuit 100 may include Trim[M:0] vector 114 and Edge[0:N] vector 116. Trim[M:0] vector 114 may connect to each delay element 102, e.g., each stage of parallel tri-state inverters. Trim[M:0] vector 114 may enable the tristate inverters within delay element 102. By connecting trim[M:0] vector 114 to each delay element 102, cells with adjustable delays may be created. According to some examples, as M increases, the stage delay reduces. The stage delay may, in some examples, correspond to the delay applied to each stage, e.g., each delay element 102. For example, as the number of parallel-tristate inverters within delay element 102 increases, the stage delay may be reduced. Edge[0:N] vector 116 may be a binary vector. The Edge[0:N] vector may be output based on the outputs of the edge registers 110, with a 1 representing where an edge was captured as it traveled down the sampler chain 106. A new Edge[0:N] vector 116 may be created every clock 112 cycle. The circuit 100 may be able to measure very fast droop events by operating with a fast clock 112.

The delay elements 102, e.g., the parallel tri-state cells, the synchronizers 104, and the XNORs 108 may have connections to one or both drain drive voltage ("VDD") and sink source voltage ("VSS"). The VDD (not shown) may be, for example, a positive supply voltage. The VSS may, in some examples, be referred to as ground ("GND") or 0V.

Figure 2A:
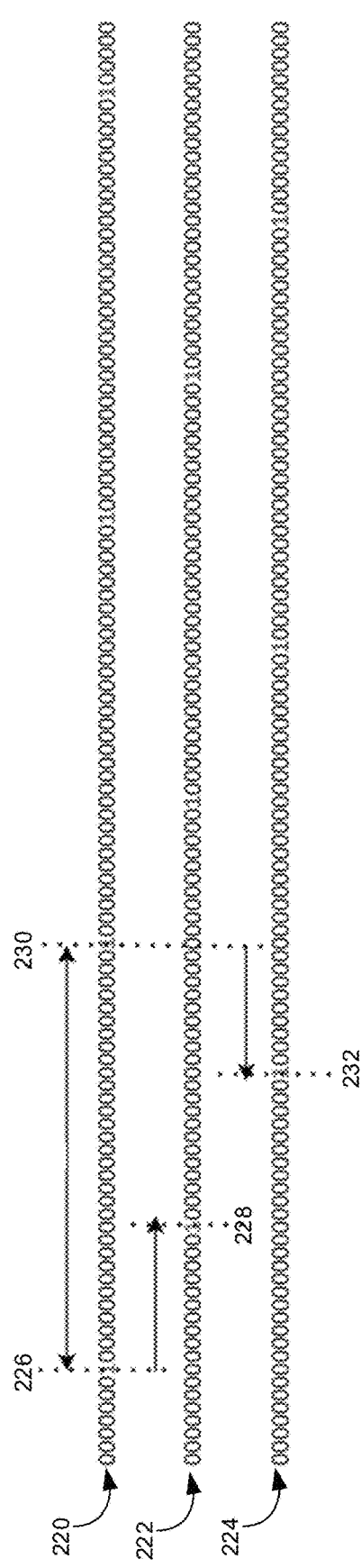
FIGS. 2A and 2B are example representations of edge vectors according to aspects of the disclosure.

FIG. 2A illustrates example representations of Edge[0:N] vectors when the circuit is in operation. Representation 220 is a representation of the Edge[0:N] vector when the circuit is operating under a steady state condition. When the circuit is operating under a steady state condition, a repetitive pulse may be applied to the start of the sample chain 106. The steady state condition may include, for example, a static VDD supply. The repetitive pulse may be, for example, a repetitive 1/0/1/0 pulse. The frequency of the pulse may be f(Clk)/N, where N is a positive value. For example, the frequency of the pulse may be f(Clk)/2, f(Clk)/4, or the like. On every clock 112 rising edge, a new Edge[0:N] vector value may be generated. The Edge[0:N] vector value may correspond to signal edges. In some examples, the Edge[0:N] vector value may be output by the edge registers 110. A value of 1 may be observed at repetitive positions within the Edge[0:N] vector. In a steady state operation, the distance between two 1's may be fixed. The expected distance can be determined via circuit simulation or lab measurement.

According to some examples, the circuit may not operate under a steady state condition. For example, rather than a static VDD supply, the VDD may vary. If the VDD voltage varies, the position of the '1' values in the Edge[0:N] vector may change. The VDD may vary due to a di/dt event on the silicon. For instance, when VDD reduces, the tri-state delay stage may get slower (Trim[M:0] is constant). The VDD may be reduced when there is a voltage droop. Such a reduction in VDD may cause the Edge[0:N] vector value 226, e.g., "1", to move to the right, as illustrated in representation 222. For example, the Edge[0:N] vector value 226 may move to the right to Edge[0:N] vector value 228. In another example, when VDD increases, the tri-state delay stage may get faster (Trim[M:0] is constant). The VDD may increase when there is a voltage spike. Such an increase in VDD may cause the Edge[0:N] vector value 230, e.g., "1", to move to the left, as illustrated in representation 224. For example, the Edge[0:N] vector value 230 may move to the left to Edge[0:N] vector value 232. The distance the Edge[0:N] vector value moves in the Edge[0:N] vector may be directly proportional to the magnitude of VDD variation, based on VDD sensitivity of the parallel tri-state cells.

Each delay element 102 may be sensitive to voltage variation. The propagation delay through the delay element 102 may vary in proportion to the change in voltage. As the voltage sensitivity of the delay elements 102 depends on the silicon process spread, also referred to as "process variation", the delay element 102 may be configured to allow the static delay through the cell to be changed (also referred to herein as "trimmed") based on silicon process information for the particular die. This process information can be obtained from silicon measurements, or process monitor ring oscillators (PMROs). The PMROs may be present on the silicon die.

Figure 2B:
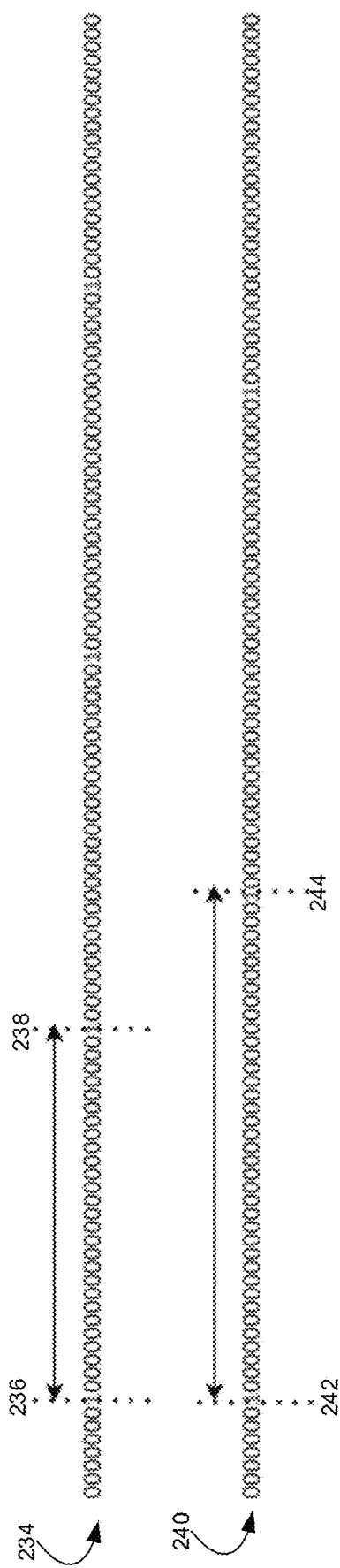

Typical silicon may achieve a consistent distance between edges, using a trim value of around M/2. The distance between edges for typical silicon may be illustrated in representation 220 in FIG. 2A, e.g., edges 226 and 230. FIG. 2B illustrates example representations of Edge[0:N] vectors for other types of silicon. For example, representation 234 is a representation of the Edge[0:N] vector for "fast" silicon. "Fast" silicon may cause the tri-state delay to be faster, thereby making the edges 236, 238 closer together than typical silicon, e.g., edge 226, 230. By reducing trim[M:0], the tri-state delay may be slowed. On the other hand, "slow" silicon may cause the tri-state delay to be slower, thereby making the edges further apart relative to typical silicon. By increasing trim [M:0], the tri-state delay may be increased. Representation 240 is a representation of the Edge[0:N] vector for "slow" silicon. The edges 242, 244 of representation 240 are farther apart as compared to the edges 226, 230 for typical silicon and edges 236, 238 for fast silicon.

The goal of process compensation (also referred to as "calibration") is to adjust trim[M:0] to achieve an edge-to-edge spacing similar to that of "typical" silicon, e.g., representation 220. This calibration may be done on every power cycle of the chip, and does not require "eFuse" bits which are generally used to store per-die compensation data in existing di/dt detection circuits. eFuse bits are one time programmable on-die fuses.

Figure 3A:
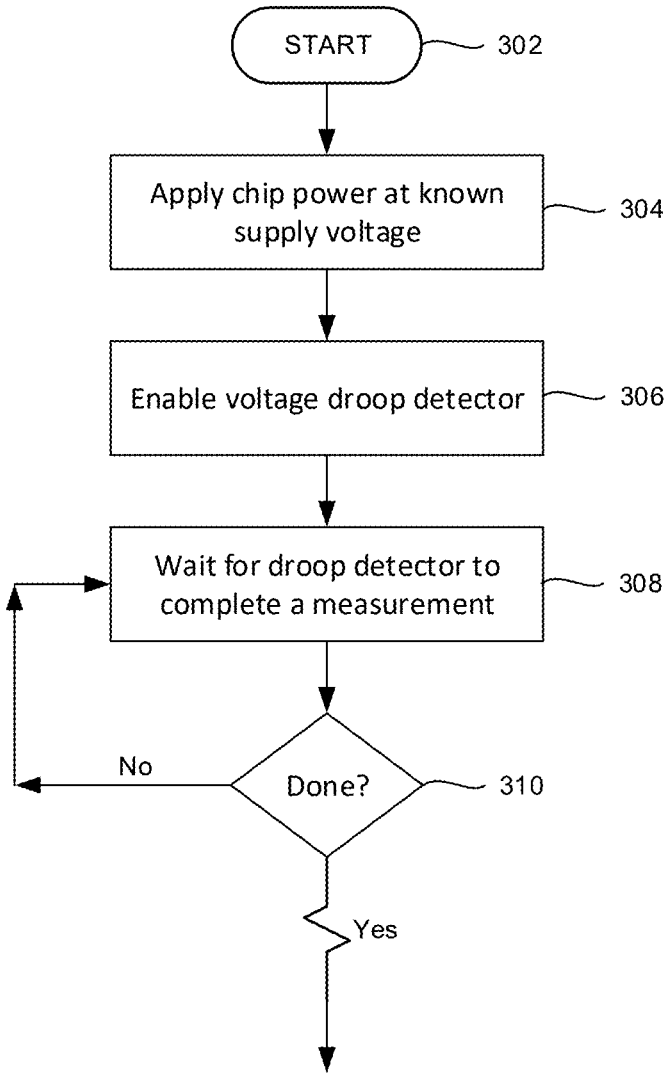
FIGS. 3A and 3B are an example method of calibrating a droop detection circuit according to aspects of the disclosure.
Figure 3B:
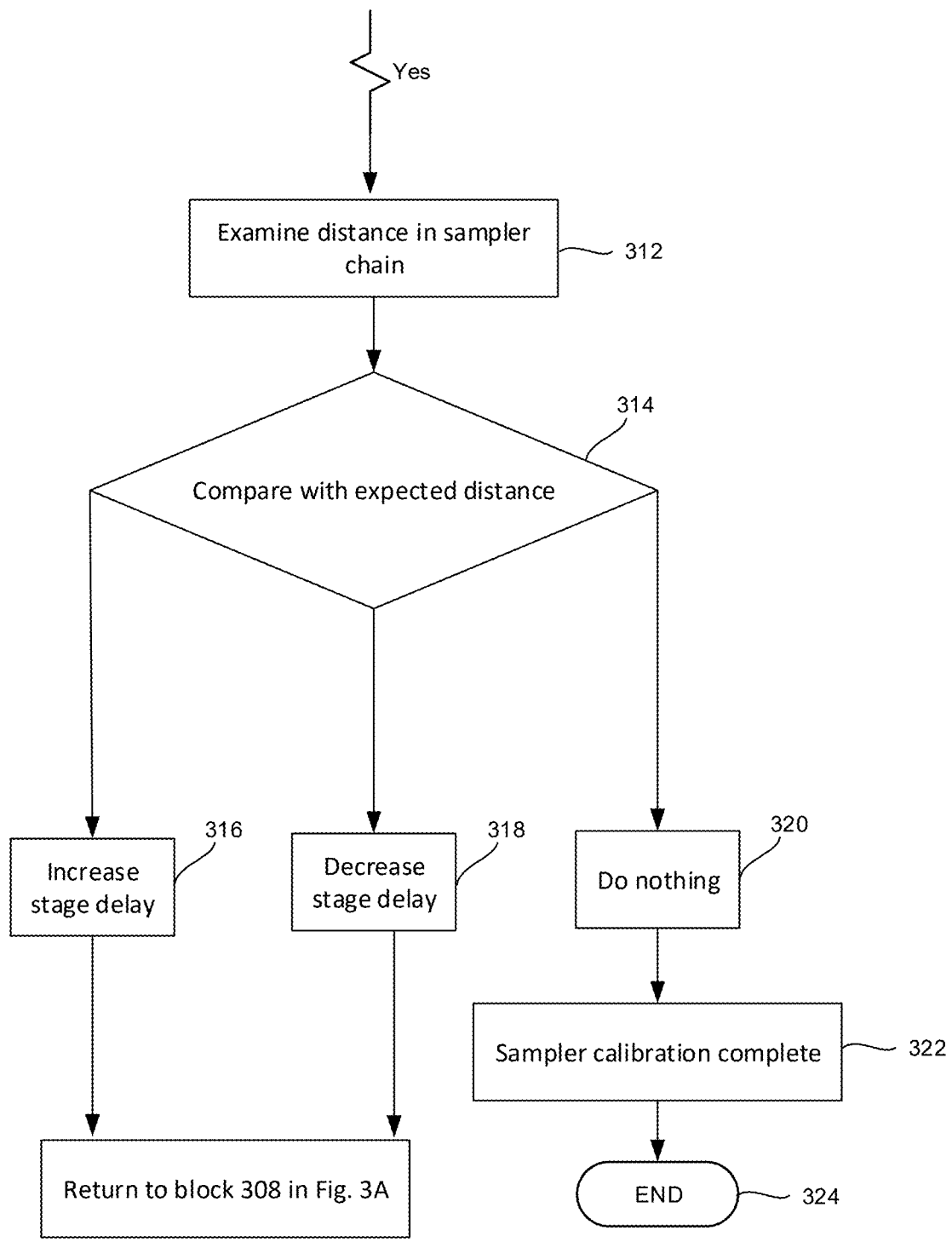

FIGS. 3A and 3B illustrate a calibration process 300. The following operations do not have to be performed in the precise order described below. Rather, various operations can be handled in a different order or simultaneously, and operations may be added or omitted.

In block 302, the calibration process may begin.

In block 304, power may be applied to the chip at a known supply voltage.

In block 306, the voltage droop detector may be enabled.

In block 308, the measurement of the voltage droop may be determined. The process may wait for the droop detector to complete its measurement of the voltage droop.

In block 310, if the droop detector has not completed its measurement, the process returns to block 308 to wait for the droop detector to complete a measurement.

The process of FIG. 3A continues to FIG. 3B when the droop detector has completed its measurement. For example, if the droop detector has completed its measurement, the process moves to block 312. In block 312, a distance in the sample chain may be examined. For example, a distance between the edge vector values in the chain may be examined. In some examples, examining the distance between the edge vector values may include determining the distance between the edge vector values. According to some examples, the edge vector values may correspond to signal edges. The signal edges, or edge vector values, may be output as a binary vector, e.g., "1", by the edge registers 110 as a signal progresses across the set of parallel tri-state inventors, e.g., delay elements 102.

In block 314, the distance between edge vector values may be compared with expected distance values. The expected distance values may be determined based on simulations at known voltages. The expected distance value may vary based on the process information for a particular die. The process information may be based on information obtained from silicon measurements, PMROs, or the like. According to some examples, typical silicon may have a first distance between edge vector values. Fast silicon may have a second distance between edge vector value, the second distance being smaller than the first distance for typical silicon. Slow silicon may have a third distance between edge vector values, the third distance being greater than the first distance for typical silicon.

According to some examples, the distance between the edge vector values may be used to determine where the chip lies on the process spread. For example, by comparing the distance between the edge vector values to the expected value, the location of the chip on the process spread may be determined.

In block 316, if the distance between edge vector values is smaller than the expected distance value, the delay may be increased. The delay may be, in some examples, a stage delay. The stage delay may be increased by increasing a trim value on a trim line connected to each parallel tri-state inverter of the set of parallel tri-state inverters.

In block 318, if the distance between edge vector values is greater than the expected distance value, the delay may be decreased. The delay may be a stage delay. The stage delay may be decreased by decreasing the trim value on the trim line connected to each parallel tri-state inverter of the set of parallel tri-state inverters.

In block 320, if the distance between edge vector values is equal to the expected distance value, no action may be taken in block 320.

In block 322, when the distance between edge vector values are equal to the expected distance value, the sampler calibration may be complete.

In block 324, the calibration process may end if the sampler chain calibration is complete.

If the length of the linear delay chain is such that the total delay of the chain is greater than two clock periods (for instance, greater than 1 nsec), then the delay chain can capture 2 or more edges into the sampler chain. Once there are 2 or more edges in the sampler chain, the distance between these edges can be determined by a hardware or software algorithm. The distance between these edges will change depending on the silicon process. As the static propagation delay of the delay element is adjusted, the edges in the sampler chain will appear to move closer together (static propagation delay reduces) or further apart (static propagation delay increases). With enough adjustment, the distance between the edges can be trimmed to keep the same distance across the complete silicon process spread. This will allow consistent monitoring and measurement of di/dt droops across all manufactured silicon parts.

According to some examples, the number of clock periods may increase as the pulse frequency is reduced. In some examples, the number of clock periods may be determined based on "N". For example, the total delay of the chain may be greater than N clock periods, where N corresponds to the "N" in Edge[0:N].

Figure 4:
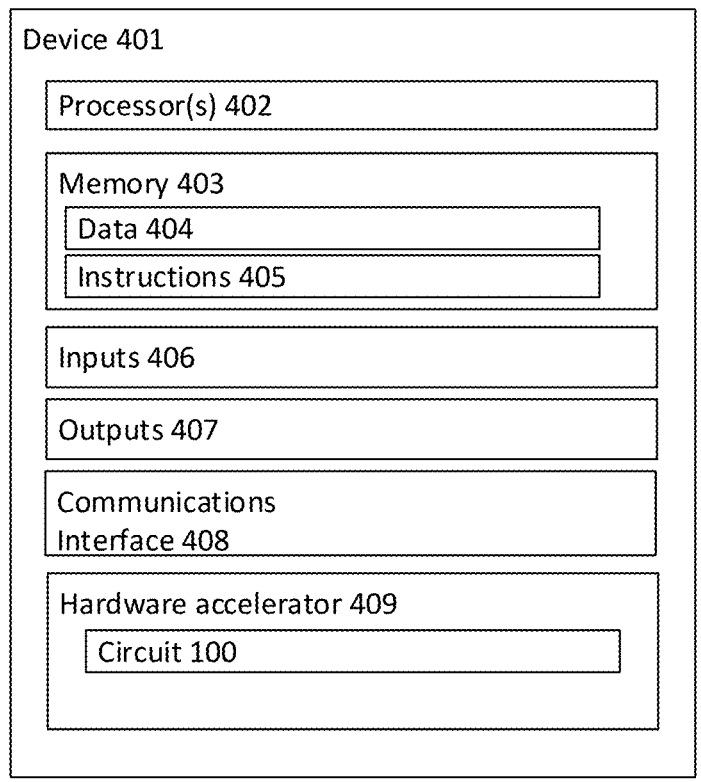
FIG. 4 is a block diagram of an example device including the droop detection circuit of FIG. 1 according to aspects of the disclosure.

FIG. 4 depicts a block diagram of an example device for implementing circuit 100. Device 401 may be a computing device. Device 401 may include one or more processors 402, memory 403, data 404 and instructions 405. The device 401 may include a hardware accelerator 409 and circuit 100, discussed above with respect to FIG. 1. Device 401 may also include inputs 406, outputs 407, and a communications interface 408. The device 401 may be, for example, a user computing device, a server computing device, or the like.

Memory 403 of device 401 may store information that is accessible by processor 402. Memory 403 may also include data that can be retrieved, manipulated or stored by the processor 402. The memory 403 may be of any non-transitory type capable of storing information accessible by the processor 402, including a non-transitory computer-readable medium, or other medium that stores data that may be read with the aid of an electronic device, such as a hard-drive, memory card, read-only memory (ROM), random access memory (RAM), optical disks, as well as other write-capable and read-only memories. Memory 403 may store information that is accessible by the processors 402, including instructions 405 that may be executed by processors 402, and data 404.

Data 404 may be retrieved, stored or modified by processors 402 in accordance with instructions 405. For instance, although the present disclosure is not limited by a particular data structure, the data 404 may be stored in computer registers, in a relational database as a table having a plurality of different fields and records, XML documents, or flat files. The data 404 may also be formatted in a computer-readable format such as, but not limited to, binary values, ASCII or Unicode. By further way of example only, the data 404 may comprise information sufficient to identify the relevant information, such as numbers, descriptive text, proprietary codes, pointers, references to data stored in other memories (including other network locations) or information that is used by a function to calculate the relevant data.

The instructions 405 can be any set of instructions to be executed directly, such as machine code, or indirectly, such as scripts, by the processor 402. In that regard, the terms "instructions," "application," "steps," and "programs" can be used interchangeably herein. The instructions can be stored in object code format for direct processing by the processor, or in any other computing device language including scripts or collections of independent source code modules that are interpreted on demand or compiled in advance. Functions, methods and routines of the instructions are explained in more detail below.

The one or more processors 402 may include any conventional processors, such as a commercially available CPU or microprocessor. Alternatively, the processor can be a dedicated component such as an ASIC or other hardware-based processor. Although not necessary, device 401 may include specialized hardware components to perform specific computing functions faster or more efficiently.

Although FIG. 4 functionally illustrates the processor, memory, and other elements of device 401 as being within the same respective blocks, it will be understood by those of ordinary skill in the art that the processor or memory may actually include multiple processors or memories that may or may not be stored within the same physical housing. Similarly, the memory may be a hard drive or other storage media located in a housing different from that of device 401. Accordingly, references to a processor or device will be understood to include references to a collection of processors or devices or memories that may or may not operate in parallel.

The hardware accelerator 409 can be any type of processor, such as a CPU, GPU, FPGA, or ASIC such as a Tensor Processing Unit (TPU). The hardware accelerator 409 may include the di/dt circuit 100. The circuit 100 may be configured to detect and measure voltage droops. Based on the voltage droops, the circuit 100 may be calibrated to account for silicon process spread. For example, when the measured droop is within predetermined limits, the system can continue to operate. However, in the event the measured droop is outside of the limits, the system can take different measures to reduce the clock frequency and therefore reduce the step change in power to prevent SDCs.

The inputs 406 may be, for example, a mouse, keyboard, touchscreen, microphone, camera, image capturing device, or any other type of input. The inputs may be configured to receive a search query.

Output 407 may be a display, such as a monitor having a screen, a touchscreen, a projector, or a television. The display 407 of the device 401 may electronically display information to a user via a graphical user interface (GUI) or other types of user interfaces. For example, display 407 may electronically display the content responsive to the search query in the format corresponding to the query intent.

The devices 401 can be at various nodes of a network and capable of directly and indirectly communicating with other nodes of the network, such as other computing devices, server computing devices, storage devices, or the like. The network and any intervening nodes can be interconnected using various protocols and systems, such that the network can be part of the Internet, World Wide Web, specific intranets, wide area networks, or local networks. The network can utilize standard communications protocols, such as WiFi, Bluetooth, 4G, 5G, etc., that are proprietary to one or more companies. Although certain advantages are obtained when information is transmitted or received as noted above, other aspects of the subject matter described herein are not limited to any particular manner of transmission.

Aspects of this disclosure can be implemented in digital electronic circuitry, in tangibly-embodied computer software or firmware, and/or in computer hardware, such as the structure disclosed herein, their structural equivalents, or combinations thereof. Aspects of this disclosure can further be implemented as one or more computer programs, such as one or more modules of computer program instructions encoded on a tangible non-transitory computer storage medium for execution by, or to control the operation of, one or more data processing apparatus. The computer storage medium can be a machine-readable storage device, a machine-readable storage substrate, a random or serial access memory device, or combinations thereof. The computer program instructions can be encoded on an artificially generated propagated signal, such as a machine-generated electrical, optical, or electromagnetic signal, that is generated to encode information for transmission to suitable receiver apparatus for execution by a data processing apparatus.

The term "configured" is used herein in connection with systems and computer program components. For a system of one or more computers to be configured to perform particular operations or actions means that the system has installed on it software, firmware, hardware, or a combination thereof that cause the system to perform the operations or actions. For one or more computer programs to be configured to perform particular operations or actions means that the one or more programs include instructions that, when executed by one or more data processing apparatus, cause the apparatus to perform the operations or actions.

The term "data processing apparatus" refers to data processing hardware and encompasses various apparatus, devices, and machines for processing data, including programmable processors, a computer, or combinations thereof. The data processing apparatus can include special purpose logic circuitry, such as a field programmable gate array (FPGA) or an application specific integrated circuit (ASIC). The data processing apparatus can include code that creates an execution environment for computer programs, such as code that constitutes processor firmware, a protocol stack, a database management system, an operating system, or combinations thereof.

The data processing apparatus can include special-purpose hardware accelerator units for implementing machine learning models to process common and compute-intensive parts of machine learning training or production, such as inference or workloads. Machine learning models can be implemented and deployed using one or more machine learning frameworks.

The term "computer program" refers to a program, software, a software application, an app, a module, a software module, a script, or code. The computer program can be written in any form of programming language, including compiled, interpreted, declarative, or procedural languages, or combinations thereof. The computer program can be deployed in any form, including as a stand alone program or as a module, component, subroutine, or other unit suitable for use in a computing environment. The computer program can correspond to a file in a file system and can be stored in a portion of a file that holds other programs or data, such as one or more scripts stored in a markup language document, in a single file dedicated to the program in question, or in multiple coordinated files, such as files that store one or more modules, sub programs, or portions of code. The computer program can be executed on one computer or on multiple computers that are located at one site or distributed across multiple sites and interconnected by a data communication network.

The term "database" refers to any collection of data. The data can be unstructured or structured in any manner. The data can be stored on one or more storage devices in one or more locations. For example, an index database can include multiple collections of data, each of which may be organized and accessed differently.

The term "engine" refers to a software-based system, subsystem, or process that is programmed to perform one or more specific functions. The engine can be implemented as one or more software modules or components, or can be installed on one or more computers in one or more locations. A particular engine can have one or more computers dedicated thereto, or multiple engines can be installed and running on the same computer or computers.

The processes and logic flows described herein can be performed by one or more computers executing one or more computer programs to perform functions by operating on input data and generating output data. The processes and logic flows can also be performed by special purpose logic circuitry, or by a combination of special purpose logic circuitry and one or more computers.

A computer or special purposes logic circuitry executing the one or more computer programs can include a central processing unit, including general or special purpose microprocessors, for performing or executing instructions and one or more memory devices for storing the instructions and data. The central processing unit can receive instructions and data from the one or more memory devices, such as read only memory, random access memory, or combinations thereof, and can perform or execute the instructions. The computer or special purpose logic circuitry can also include, or be operatively coupled to, one or more storage devices for storing data, such as magnetic, magneto optical disks, or optical disks, for receiving data from or transferring data to. The computer or special purpose logic circuitry can be embedded in another device, such as a mobile phone, a personal digital assistant (PDA), a mobile audio or video player, a game console, a Global Positioning System (GPS), or a portable storage device, e.g., a universal serial bus (USB) flash drive, as examples.

Computer readable media suitable for storing the one or more computer programs can include any form of volatile or non-volatile memory, media, or memory devices. Examples include semiconductor memory devices, e.g., EPROM, EEPROM, or flash memory devices, magnetic disks, e.g., internal hard disks or removable disks, magneto optical disks, CD-ROM disks, DVD-ROM disks, or combinations thereof.

Aspects of the disclosure can be implemented in a computing system that includes a back end component, e.g., as a data server, a middleware component, e.g., an application server, or a front end component, e.g., a client computer having a graphical user interface, a web browser, or an app, or any combination thereof. The components of the system can be interconnected by any form or medium of digital data communication, such as a communication network. Examples of communication networks include a local area network (LAN) and a wide area network (WAN), e.g., the Internet.

The computing system can include clients and servers. A client and server can be remote from each other and interact through a communication network. The relationship of client and server arises by virtue of the computer programs running on the respective computers and having a client-server relationship to each other. For example, a server can transmit data, e.g., an HTML page, to a client device, e.g., for purposes of displaying data to and receiving user input from a user interacting with the client device. Data generated at the client device, e.g., a result of the user interaction, can be received at the server from the client device.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the examples should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible implementations. Further, the same reference numbers in different drawings can identify the same or similar elements.

The invention claimed is:

1. A droop detection circuit, the droop detection circuit comprising:
    a set of parallel tri-state inverters;
    a set of synchronizers;
    a set of XNORs; and
    a set of edge registers,
    wherein each parallel tri-state inverter of the set of parallel tri-state inverters is connected to a respective synchronizer of the set of synchronizers, pairs of adjacent synchronizers of the set of synchronizers are connected to a XNOR in the set of XNORs, and each XNOR is connected to a respective edge register in the set of edge registers.

2. The droop detection circuit of claim 1, wherein a trim line is connected to each parallel tri-state inverter of the set of parallel tri-state inverters.

3. The droop detection circuit of claim 1, wherein a voltage line, VDD, is connected to each parallel tri-state inverter of the set of parallel tri-state inverters.

4. The droop detection circuit of claim 1, wherein a clock is connected.

5. The droop detection circuit of claim 1, wherein the set of parallel tri-state inverters includes "N" number of parallel tri-state inverters, N being an integer greater than 0.

6. The droop detection circuit of claim 1, wherein each parallel tri-state inverter of the set of parallel tri-state inverters includes 24 to 32 inverters.

7. The droop detection circuit of claim 1, wherein each synchronizer of the set of synchronizers is a metastability enhanced D-type flip-flop.

8. The droop detection circuit of claim 7, wherein each flip-flop shares a common clock.

9. The droop detection circuit of claim 1, wherein the set of edge registers output a binary vector representing signal edges, as a signal progresses across the set of parallel tri-state inverters.

10. The droop detection circuit of claim 9, wherein a distance between signal edges is constant when a supplied voltage to the set of parallel tri-state inverters is constant.

11. The droop detection circuit of claim 9, wherein signal edges move right when a supplied voltage to the set of parallel tri-state inverters has a voltage droop.

12. The droop detection circuit of claim 9, wherein signal edges move left when a supplied voltage to the set of parallel tri-state inverters has a voltage increase.

13. The droop detection circuit of claim 9, wherein signal edges move closer together when a trim value on a trim line connected to each parallel tri-state inverter of the set of parallel tri-state inverters is reduced.

14. The droop detection circuit of claim 9, wherein signal edges move apart when a trim value on a trim line connected to each parallel tri-state inverter of the set of parallel tri-state inverters is increased.

15. The droop detection circuit of claim 9, wherein a location of a chip on a process spread is determined based on a comparison of a distance between signal edges and an expected distance.

* * * * *